US008779456B2

(12) United States Patent
Mastro

(10) Patent No.: US 8,779,456 B2
(45) Date of Patent: Jul. 15, 2014

(54) INVERTED LIGHT-EMITTING DIODE HAVING PLASMONICALLY ENHANCED EMISSION

(71) Applicant: Michael A. Mastro, Fairfax, VA (US)

(72) Inventor: Michael A. Mastro, Fairfax, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/107,264

(22) Filed: Dec. 16, 2013

(65) Prior Publication Data

US 2014/0103291 A1     Apr. 17, 2014

Related U.S. Application Data

(62) Division of application No. 13/311,673, filed on Dec. 6, 2011, now Pat. No. 8,653,550.

(60) Provisional application No. 61/424,103, filed on Dec. 17, 2010.

(51) Int. Cl.
  *H01L 33/00*  (2010.01)
  *H01L 33/44*  (2010.01)
  *H01L 33/40*  (2010.01)
  *H01L 33/46*  (2010.01)

(52) U.S. Cl.
  CPC ............... *H01L 33/44* (2013.01); *H01L 33/40* (2013.01); *H01L 2933/0083* (2013.01); *H01L 2933/0091* (2013.01); *H01L 33/465* (2013.01)
  USPC .......................... 257/98; 257/99; 257/E33.007

(58) Field of Classification Search
  USPC ........................................ 257/98, 99, E33.007
  See application file for complete search history.

(56) References Cited

U.S. PATENT DOCUMENTS

| 6,410,940 B1 | 6/2002 | Jiang et al. |
| 7,170,097 B2 | 1/2007 | Edmond et al. |
| 2002/0017650 A1 | 2/2002 | Nikolaev et al. |
| 2011/0220871 A1 | 9/2011 | Kamikawa et al. |

OTHER PUBLICATIONS

Michael A. Mastro, Joshua D. Caldwell, Ron T. Holm, Rich L. Henry, and Charles R. Eddy Jr., "Design of Gallium Nitride Resonant Cavity Light-Emitting Diodes on Si Substrates," Adv. Mater. 2008, 20, 115-118.

(Continued)

*Primary Examiner* — Matthew Reames
(74) *Attorney, Agent, or Firm* — US Naval Research Laboratory; Joslyn Barritt

(57) ABSTRACT

An LED device having plasmonically enhanced emission is provided. The device includes an inverted LED structure with a coating of metal nanoparticles on the surface chosen to match the plasmonic response to the peak emission from the active quantum well (QW) emission region of the LED. The active QW emission region is separated from the metal nanoparticles on the surface by a thin n-type contact layer disposed on a top side of the active QW emission. A p-type layer is disposed immediately beneath the active QW emission region and injects holes into the active QW emission region. The n-type contact layer is sufficiently thin to permit a coupling of the surface plasmons (SPs) from the metal nanoparticles and the excitons in the active QW emission region. The SP-exciton coupling provides an alternative decay route for the excitons and thus enhances the photon emission from the LED device.

13 Claims, 6 Drawing Sheets

(56) References Cited

OTHER PUBLICATIONS

Michael A. Mastro, Chul Soo Kim, Mijin Kim, Josh Caldwell, Ron T. Holm, Igor Vurgaftman, Jihyun Kim, Charles R. Eddy, Jr., and Jerry R. Meyer, "Zinc Sulphide Overlayer Two-Dimensional Photonic Crystal for Enhanced Extraction of Light from a Micro Cavity Light-Emitting Diode" Japanese Journal of Applied Physics vol. 47, No. 10, 2008, pp. 7827-7830.

Byung-Jae Kim, Michael A. Mastro, Hyunjung Jung, Hong-Yeol Kim, Sung Hyun Kim, Ron T. Holm, Jennifer Hite, Charles R. Eddy Jr., Joona Bang, and Jihyun Kim, "Inductively coupled plasma etching of nano-patterned sapphire for flip-chip GaN light emitting diode applications" Thin Solid Films 516 (2008) 7744-7747.

B. J. Kim, H. Jung, J. Shin, M. Mastro, C. Eddy Jr., J. Hite, S. Kim, J. Bang, and J. Kim, Enhancement of light extraction efficiency of ultraviolet light emitting diodes by patterning of SiO2 nanosphere arrays, Thin Solid Films 517 (2009) 2742-2744.

T. Takeuchi, G. Hasnain, S. Corzine, M. Hueschen, R. Schneider, Jr., C. Kocot, M. Blomqvist, Y. Chang, D. Lefforge, M.. Krames, L. Cook, and S. Stockman, "GaN-Based Light Emitting Diodes with Tunnel Junctions," Jpn. J. Appl. Phys. vol. 40 (2001) pp. L 861-L 836.

C. Langhammer, Z. Yuan, I. Zorić, and B. Kasemo, "Plasmonic Properties of Supported Pt and Pd Nanostructures," Nano Letters 2006 vol. 6, No. 4 833-836.

K. W. Liu, Y. D. Tang, C. X. Cong, T. C. Sum, A. C. H. Huan, Z. X. Shen, Li Wang, F. Y. Jiang, X. W. Sun, and H. D. Sun, "Giant enhancement of top emission from ZnO thin film by nanopatterned Pt," Applied Physics Letters 94, 151102 (2009).

K. Okamoto, I. Niki, A. Shvartser, Y. Narukawa, T. Mukai, and A. Scherer, "Surface-plasmon-enhanced light emitters based on InGaN quantum wells," Nature Materials, vol. 3, No. 9, pp. 601-605 (2004).

A. Neogi and H. Morkoç, "Resonant surface plasmon-induced modification of photoluminescence from GaN/AlN quantum dots," Nanotechnology 15 (2004) 1252-1255.

M. Kwon, J. Kim, B. Kim, I. Park, C. Cho, C. Byeon, and S. Park, "Surface-Plasmon-Enhanced Light-Emitting Diodes" Adv. Mater. 2008, 20, 1253-1257.

M. Mastro, "Fundamentals and future of semiconductor device technology," in "III-V Compound Semiconductors: Integration with Silicon-Based Microelectronics", CRC / Taylor & Francis, 2011.

Linlin Zhao, K. Lance Kelly, and George C. Schatz, "The Extinction Spectra of Silver Nanoparticle Arrays: Influence of Array Structure on Plasmon Resonance Wavelength and Width," J. Phys. Chem. B 2003, 107, 7343-7350.

René Kullock, Stefan Grafström, Paul R. Evans, Robert J. Pollard, and Lukas M. Eng, "Metallic nanorod arrays: negative refraction and optical properties explained by retarded dipolar interactions," J. Opt. Soc. Am. B, vol. 27, No. 9 pp. 1819-1827 (Sep. 2010).

Michael A. Mastro, Jaime A. Freitas Jr., Orest Glembocki, Charles R. Eddy Jr., R.T. Holm, Rich L. Henry, Josh Caldwell, Ronald W. Rendell, Fritz Kub, and J. Kim, "Plasmonically enhanced emission from a group-III nitride nanowire emitter," Nanotechnology 18 (2007) 265401.

G. Sun, J. B. Khurgin, R. A. Soref, Plasmonic light-emission enhancement with isolated metal nanoparticles and their coupled arrays, J. Opt. Soc. Am. B 25, 1748 (2008).

INVERTED LIGHT-EMITTING DIODE HAVING PLASMONICALLY ENHANCED EMISSION

CROSS-REFERENCE

This application is a Divisional of, and claims the benefit of priority based on, U.S. patent application Ser. No. 13/311,673 filed on Dec. 6, 2011, which is a Nonprovisional of, and claims the benefit of priority based on, U.S. Provisional Patent Application No. 61/424,103 filed on Dec. 17, 2010, both of which are hereby incorporated by reference into the present application in their entirety.

TECHNICAL FIELD

The present invention relates to semiconductor-based devices, specifically light-emitting diodes.

BACKGROUND

The efficiency of semiconductor light-emitting diodes (LEDs) has continuously improved since the first fabrication of an infrared device in 1960. The key metric has been the external quantum efficiency (EQE), which describes the number of photons externally radiated per electron injected into the device. The external quantum efficiency is the product of the injection efficiency, internal quantum efficiency, and extraction efficiency.

The injection efficiency of an LED describes the fraction of electrons that are injected into the active region relative to the number of electrons flowing into the active region. The internal quantum efficiency describes the ratio of photons generated in the active region by radiative transitions relative to the sum all radiative and non-radiative processes, and can be improved by increasing the rate of radiative transitions or by decreasing the rate of non-radiative transitions, e.g., by introducing additional radiative states or states that couple to radiative states.

The extraction efficiency of an LED describes the fraction of photons that escape the device relative to the number of photons generated in the active region. When the electron-hole pairs generated in the active region of an LED decay, they can either decay radiatively by emitting a photon and thus producing light, or can decay non-radiatively as dissipated energy in the crystal lattice, for example by producing heat. In a simple planar LED, the light is emitted in an "escape cone" whose properties are defined by the LED's angle of total internal reflection at the semiconductor/atmosphere interface. The remainder of the light is trapped within the LED structure by total internal reflection and can only escape at the ends of the semiconductor slab making up the LED or through some imperfection in the device surface.

A major vein of LED research is directed to enhancing the extraction efficiency of light from the semiconductor into the surrounding atmosphere by modifying the optical structure in or around the semiconductor host.

Some researchers have employed a microcavity in the LED to guide the preferential propagation of generated photons into the light extraction cone of the LED. See M. Mastro, J. Caldwell, R. Holm, R. Henry, and C. Eddy Jr., "Design of Gallium Nitride Resonant Cavity Light-Emitting Diodes on Si Substrates," *Adv. Mater.* 2008, 20, 115-118.

Others have used a photonic crystal deposited on an LED to diffract and redirect the light out of the semiconductor and into the atmosphere. See M. Mastro, C. Kim, M. Kim, J. Caldwell, R. Holm, I. Vurgaftman, J. Kim, C. R. Eddy, Jr., and J. Meyer, "Zinc Sulphide Overlayer Two-Dimensional Photonic Crystal for Enhanced Extraction of Light from a Micro Cavity Light-Emitting Diode" *Japanese Journal of Applied Physics*, Vol. 47, No. 10, 2008, pp. 7827-7830.

Still others have attempted to improve the extraction of light from an LED by roughening a surface of the semiconductor structure, thus scattering the emitted photons and enhancing the light extraction efficiency. See B. Kim, M. Mastro, H. Jung, H. Kim, S. Kim, R. Holm, J. Hite, C. Eddy Jr., J. Bang, and J. Kim, "Inductively coupled plasma etching of nano-patterned sapphire for flip-chip GaN light emitting diode applications" *Thin Solid Films* 516 (2008) 7744-7747; and B. J. Kim, H. Jung, J. Shin, M. Mastro, C. Eddy Jr., J. Hite, S. Kim, J. Bang, and J. Kim, "Enhancement of light extraction efficiency of ultraviolet light emitting diodes by patterning of $SiO_2$ nanosphere arrays, *Thin Solid Films* 517 (2009) 2742-2744.

Another approach to improving light extraction from an LED has been to invert the structure of the LED itself. In a traditional GaN-based LED structure, the final grown layer is a p-type GaN contact layer to avoid magnesium memory effects and doping-generated growth defects. Use of low-resistance Ohmic contacts to the p-type region requires a high level of magnesium doping in the p-type contact layer. To minimize the growth of and contacting to the p+GaN contact layer, an inverted LED structure has been suggested by various commercial entities. See, e.g., U.S. Pat. No. 7,170,097 to Edmond et al., entitled "Inverted Light Emitting Diode on Conductive Substrate"; and T. Takeuchi, G. Hasnain, S. Corzine, M. Hueschen, R. Schneider, Jr., C. Kocot, M. Blomqvist, Y. Chang, D. Lefforge, M. frames, L. Cook, and S. Stockman, "GaN-Based Light Emitting Diodes with Tunnel Junctions," *Jpn. J. Appl. Phys.* Vol. 40 (2001) pp. L 861-L 863.

Operation of such an inverted LED device is similar to operation of a standard LED in that electron and holes from n- and p-type regions, respectively, are injected into a quantum well active region. However, in most cases an inverted LED structure has both Ohmic contacts made to n-type material. This creates an npn semiconductor that would prohibit current flow in either the forward or reverse direction for non-degenerate doping levels. Such an inverted LED, biased by two n-type contacts, will often include a (degenerate) n++/p++ tunnel junction that under local reverse bias allows electrons to quantum-mechanically tunnel through a thin depletion region into the p-type layer adjacent to the active region. At this point, the operation is similar to a traditional LED where holes are injected into the active region from the adjacent p-type layer and electrons are injected from the adjacent n-type layer into the active region, where the electrons and holes may recombine radiatively.

Still another approach has found that introduction of a plasmonic metal in the near vicinity (tens of nanometers) of the semiconductor active region can improve the emission of light from an LED.

A surface plasmon (SP) from such plasmonic metals at a perfectly flat metal/semiconductor interface is in the form of a non-propagating evanescent wave. If the SP is not coupled to the excitons (i.e., the electron-hole pairs) formed in the active quantum well (QW) region, any emitted photon can be non-radiatively absorbed into the metal surface and dissipated as heat. See C. Langhammer, Z. Yuan, I. Zorić, and B. Kasemo, "Plasmonic Properties of Supported Pt and Pd Nanostructures," *Nano Letters* 2006 Vol. 6, No. 4 833-838. However, when the excitons within the active QW region and the SPs within the plasmonic metal are coupled, the energy in the exciton transitions into the surface plasmon state in the metal or at the metal/dielectric (which is usually a semiconductor) interface. The surface plasmon will oscillate or propagate for a short time but eventually either will dissipate as heat via a phonon or will scatter as a photon in the air and be emitted from the device. Thus, by coupling the SPs and the excitons, an alternative decay route for the excitons is created, which improves the probability that the exciton will decay into an SP and scatter, thus produce light. K. W. Liu, Y. D. Tang, C. X. Cong, T. C. Sum, A. C. H. Huan, Z. X. Shen, Li Wang, F. Y. Jiang, X. W. Sun and H. D. Sun, Appl. Phys. Lett., 94, 151102 (2009). This coupling occurs when the energy of the electron-hole pair has sufficient overlap in energy with the energy of the surface plasmon (SP) resonance condition.

The QW must be in close proximity to the plasmonic metal in order for the QW excitons to be located within the SP fringing field so that they may be coupled into the SP state. Okamoto et al. calculated the fringing field depth as 47 and 77 nm for silver and aluminum, respectively. See K. Okamoto, I. Niki, A. Shvartser, Y. Narukawa, T. Mukai, and A. Scherer, "Surface-plasmon-enhanced light emitters based on InGaN quantum wells," *Nature Materials*, Vol. 3, No. 9, pp. 601-605 (2004).

Many approaches have been taken to improve the SP-exciton coupling and enhance the emission of scattered light. For example, Okamoto et al. found large enhancements in the emission from InGaN quantum well (QW) devices when a thin film of platinum or silver was deposited 10 nm above the QW, relying on imperfections and roughness in the metal coating to couple the surface plasmons into scattered light. See Okamoto, supra.

Another approach involves structuring the plasmonic metal as nanoparticles. Such structuring allows for tuning of the SP resonance condition where the SP density of states (DOS) is extremely high, to closely match the peak emission of the active layer of the semiconductor emitter. In addition, the periodicity of the metal nanoparticles allows a more controlled scattering of the SPs into radiative photons. See A. Neogi and H. Morkoç, "Resonant surface plasmon-induced modification of photoluminescence from GaN/AlN quantum dots," *Nanotechnology* 15 (2004) 1252-4255, who deposited arrays of silver nanoparticles onto a structure with GaN quantum dots located in close proximity to the surface.

However, as noted above, in order to achieve coupling of the exciton and the SP, the plasmonic metal must be situated very close, usually within 30 nm, to the active QW of the LED device. This necessity presents a subtle dilemma to construction of a functional plasmonic enhanced (In,Al)GaN LED. In a traditional GaN-based LED structure, use of low-resistance Ohmic contacts to the p-type region is based on magnesium doping in the p-type contact layer. However, -magnesium is a deep acceptor and cannot produce a high level of activated holes in (In,Al)GaN. The low hole concentration in the traditional p-type GaN top contact layer requires a thickness of at least 200 nm to achieve proper current spreading. In addition, a thin, i.e., less than 80 nm, p-type (In,Al)GaN top contact layer would exhibit band bending from the surface states that would hamper the injection of holes into the active region.

The magnesium dopant also has a high activation energy, which limits the density of active acceptors to approximately $10^{18}$ cm$^{-3}$ at room temperature. For a simple pn junction, this corresponds to a p side depletion width of 32.2 nm and an n side (with $5 \times 10^{18}$ cm$^{-3}$ active donors) depletion width of 6.5 nm. Once depletion from the surface is included, the necessary theoretical thickness of the p-type region is already beyond the SP fringing field depth and thus coupling will not occur. In practice, the high level of defects also results in low carrier mobility and thus high resistivity of the p-GaN, which necessitates a thick (100 to 250 nm) current-spreading p-type layer in commercial LEDs, which only exacerbates this issue.

Kwon et al. attempted to avoid this issue by interrupting the growth, placing the silver nanoparticles internal to the semiconductor, and then continuing the growth; specifically, the plasmonic metal layer was situated in the n-GaN within a few nanometers of the multi-QW. See M. Kwon, J. Kim, B. Kim, I. Park, C. Cho, C. Byeon, and S. Park, "Surface-Plasmon-Enhanced Light-Emitting Diodes" *Adv. Mater.* 2008, 20, 1253-1257. Although Kwon et al. maintained that the semiconductor crystal was not perturbed by the discontinuous silver interlayer, any foreign particle would very likely disturb the crystallographic stacking during epitaxy, and SPs of the silver interlayer that do scatter are emitted as photons within the semiconductor slab and so will suffer from extraction issues (e.g., total internal reflection) that are problematic for all LEDs.

Thus, it would be advantageous to place the plasmonic metal exterior to the semiconductor slab making up the LED so that the SP-exciton energy couples from the active region to the metal, thus avoiding the necessity to exit via the semiconductor/air light cone.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides an LED device having plasmonically enhanced emission.

A device in accordance with the present invention includes an inverted LED structure with a coating of metal nanoparticles on the surface. The coating would be in the form of a periodic or random coating of silver, gold, copper or similar plasmonic metal chosen to match the plasmonic response to the peak emission from the active quantum well (QW) emission region of the LED.

The active QW emission region is separated from the metal nanoparticles on the surface by a thin n-type contact layer disposed on a top side of the active QW emission region which injects electrons into the active QW emission region and is contacted to an n-type Ohmic electrode. The n-type layer is less than 50 nm thick, and preferably is less than 30 nm thick.

A p-type layer that injects holes into the active QW emission region is disposed immediately beneath the active QW emission region such that the active QW emission region is between the n-type layer and the p-type layer. In some embodiments the p-type layer is a relatively thick p-type layer contacted to a p-type Ohmic electrode and deposited on a substrate such as sapphire, SiC, Si, GaN, ZnO or AN that is not involved in the current transport. In other embodiments, the p-type layer is a relatively thin p-type layer contacted by a p-type electrode and grown on a p-type substrate such as p-type SiC or p-type GaN.

In still other embodiments, both the top and bottom electrodes are n-type Ohmic contacts. In such embodiments, one n-type Ohmic contact is made to the n-type contact layer at the top of the LED structure. The other n-type Ohmic contact is made to an n-type GaN base layer at the bottom of the LED structure or to an n-type substrate such as SiC with an overlying n-type GaN base layer, with an $n^{++}/p^{++}$ tunnel junction disposed onto the n-type GaN base layer. Current will quantum mechanically tunnel from the n-type GaN layer through the tunnel junction into a p-type GaN layer from which holes will be injected into the active quantum well emission region.

In all cases, the n-type contact layer is sufficiently thin to permit a coupling of the surface plasmons (SPs) from the metal nanoparticles and the excitons, i.e., the electron-hole pairs, formed in the active QW emission region. The SP-exciton coupling provides an alternative decay route for the excitons and thus enhances the photonic emission from the LED device.

BRIEF DESCRIPTION OF THE DRAWINGS

FIG. 4A illustrates photoluminescence in the range of about 350-600 nm and FIG. 4B illustrates photoluminescence in the range of about 350-390 nm.

DETAILED DESCRIPTION

Figure 1:
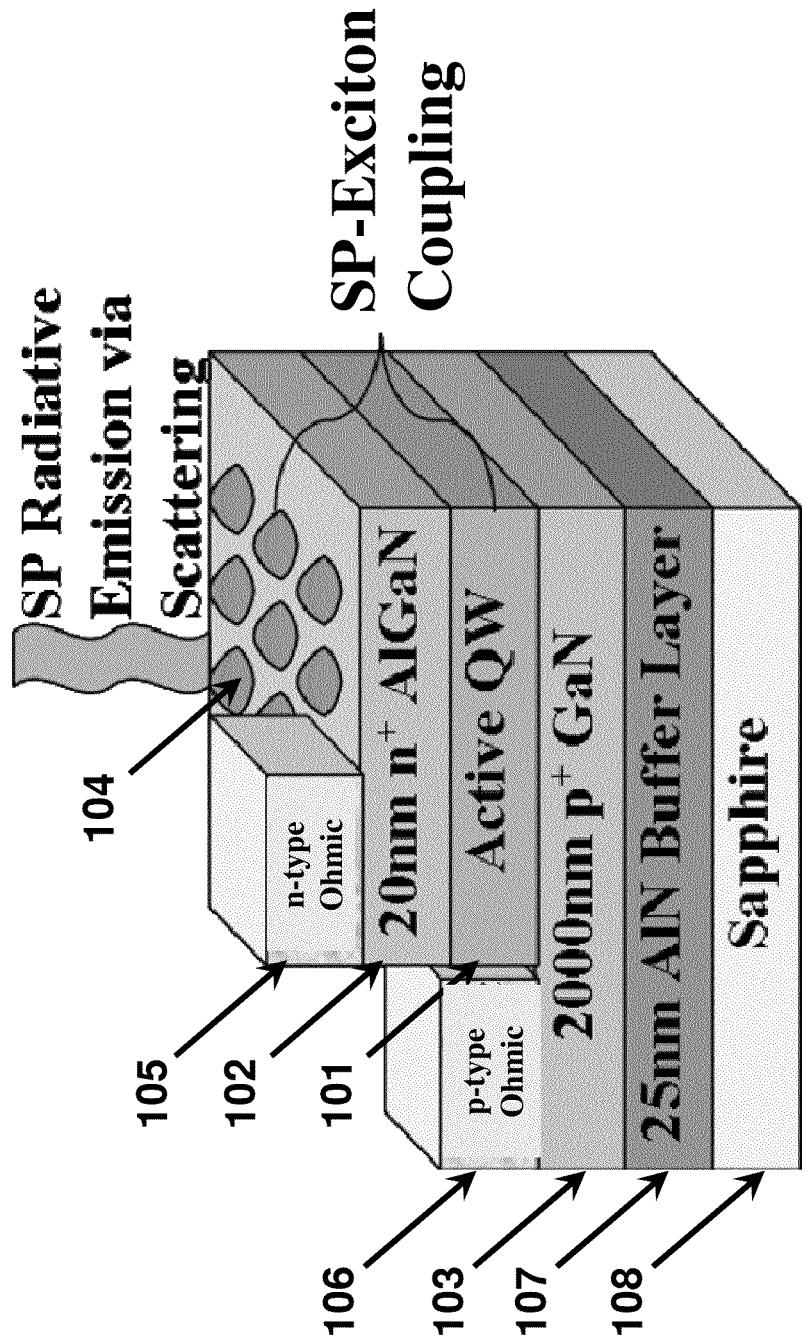
FIG. 1 depicts a first exemplary embodiment of an inverted LED having plasmonically enhanced emission in accordance with the present invention.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

For example, although the present invention may be described in the context of a device composed of n-type (In,Al)GaN and p-type GaN layers, the plasmonically enhanced light emitting device in accordance with the present invention can be composed of any semiconductor materials, including GaN/AlGaN/InGaN/InAlGaN, ZnO/MgZnO, ZnSe/ZnMgSe, CdTe/CdZnTe and similar semiconductors, and all such devices are contemplated to be within the scope of the present invention. The present invention is most advantageous to semiconductor materials that are difficult to produce with high-quality n-type and p-type regions. The quality can be defined as crystal quality. The quality can also be defined as the ability to achieve both high electron and hole carrier concentrations, which is particularly problematic in wide-bandgap semiconductors. See M. Mastro, "Fundamentals and future of semiconductor device technology," in *"III-V Compound Semiconductors: Integration with Silicon-Based Microelectronics"*, CRC/Taylor & Francis, 2011.

The present invention provides an LED device having plasmonically enhanced emission.

An inverted LED in accordance with the present invention includes any structure that has a thin n-type region between the active region and the surface of the semiconductor. One inverted or reversed structure is an (Al,In,Ga)N LED in which the n-type layers are above the active region and the p-type layers are below the active region. This n-type region/active region/p-type region is the reverse of the standard (Al,In,Ga)N LED growth stack of p-type region/active region/n-type region/substrate.

In the (Al,In,Ga)N layer or layers, a high n-type carrier concentration is easily attainable by doping with silicon. The high doping allows the thin n-type layer between the surface of the semiconductor and the active region to properly spread the current from the contact. Additionally, the top thin layer requires a high doping to prevent the states at the bare surface or metallized surface from interacting with band structure at the active region.

Thus, as described in more detail below, a device in accordance with the present invention includes an inverted LED structure with a coating of metal nanoparticles on the surface. The coating would be in the form of a periodic or random coating of silver, gold, copper or similar plasmonic metal chosen to match the plasmonic response to the peak emission from the active quantum well (QW) emission region of the LED.

The active QW emission region is separated from the metal nanoparticles on the surface by a thin n-type (In,Al)GaN contact layer disposed on a top side of the active QW emission region which injects electrons into the active QW emission region and is contacted to an n-type Ohmic electrode. The n-type layer is less than 50 nm thick, and preferably is less than 30 nm thick.

A p-type layer that injects holes into the active QW emission region is disposed immediately beneath the active QW emission region such that the active QW emission region is between the n-type layer and the p-type layer. In some embodiments the p-type GaN layer is a relatively thick, typically about 500 to 5000 nm, p-type layer contacted to a p-type Ohmic electrode and deposited on a substrate such as sapphire, SiC, Si, GaN, ZnO or AN that is not involved in the current transport. In other embodiments, the p-type GaN layer is a relatively thin, typically about 10 to 500 nm, p-type layer contacted by a p-type electrode and grown on a p-type substrate such as p-type SiC or p-type GaN.

In still other embodiments, both the top and bottom electrode are n-type Ohmic contacts. In such embodiments, one n-type Ohmic contact is made to the n-type contact layer at the top of the LED structure. The other n-type Ohmic contact is made to an n-type GaN base layer at the bottom of the LED structure or to an n-type substrate such as SiC with an overlying n-type GaN base layer, with an $n^{++}/p^{++}$ tunnel junction disposed onto the n-type GaN base layer. Current will quantum mechanically tunnel from the n-type GaN base layer through the tunnel junction into a p-type GaN layer from which holes will be injected into the active quantum well emission region.

In all cases, the n-type contact layer must be sufficiently thin so that the plasmonic metal is close enough to the active QW region to permit a coupling of the surface plasmons (SPs) from the metal nanoparticles and the excitons, i.e., the electron-hole pairs, formed in the active QW emission region. When the excitons within the active QW region are coupled to the SPs within the plasmonic metal, the energy in the exciton transitions into the surface plasmon state in the metal or at the metal/dielectric (which is usually a semiconductor) interface. Any non-uniformity in the metal will introduce a scattering site that will bridge the momentum mismatch between the plasmon and the photon. The surface plasmon thus will oscillate or propagate for a short time but eventually will dissipate as heat via a phonon or alternatively will scatter as a photon in the air and be emitted from the device. The SP-exciton coupling thereby provides a decay route for the excitons in the active QW region in addition to the decay route taken by non-coupled excitons and thus enhances the photonic emission from the LED device. The decay route for the coupled plasmon resulting in a photon occurs when the resonance of the plasmonic state is matched to the emission of the quantum well, which is typically the intense near-bandedge emission, with the peak resonance of the plasmonic states being determined by its composition, geometry, and local dielectric environment including the composition of the semiconductor.

Figure 2:
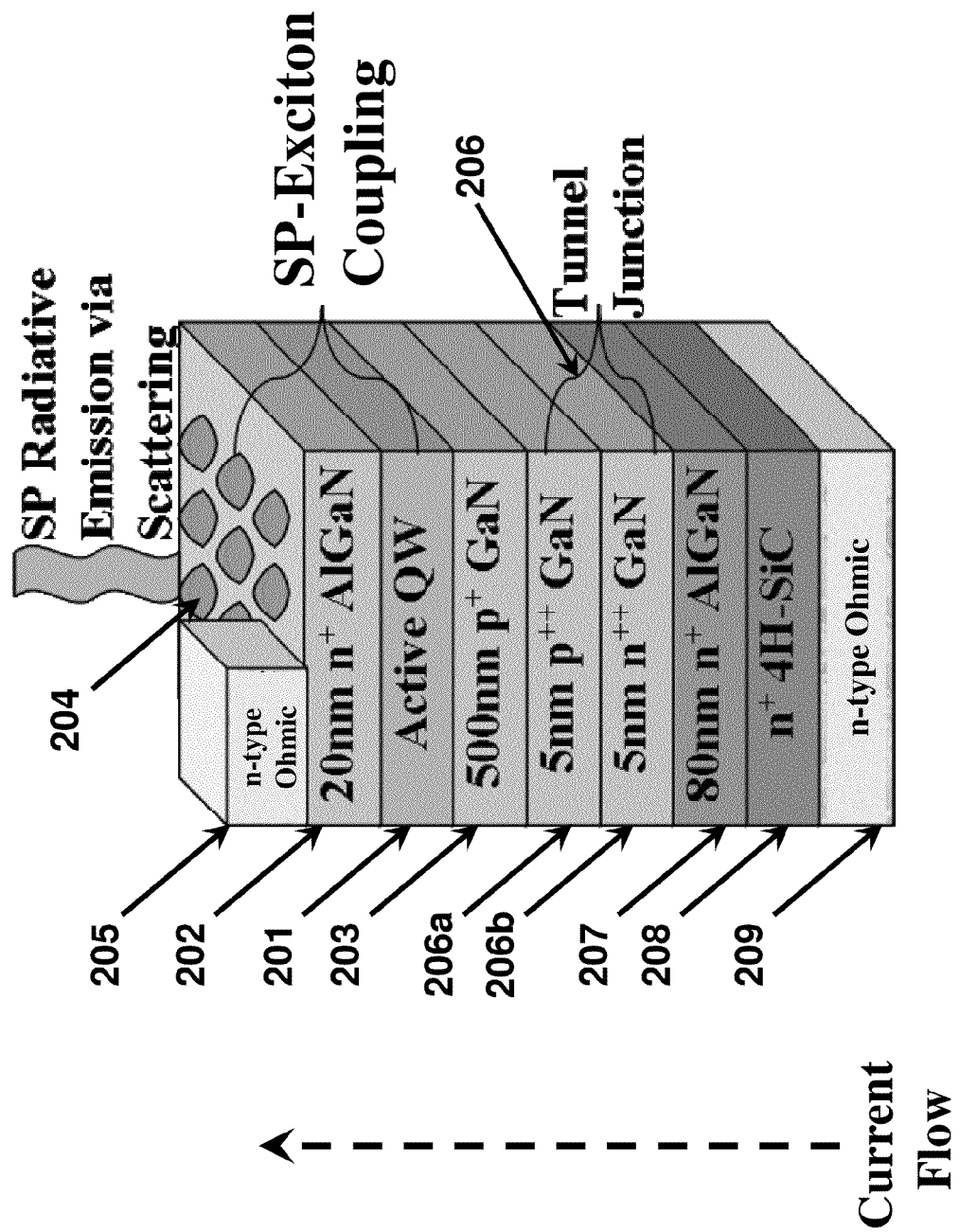
FIG. 2 depicts a second exemplary embodiment of an inverted LED having plasmonically enhanced emission in accordance with the present invention.

FIGS. 1 and 2 illustrate two exemplary embodiments of an inverted LED device having plasmonically enhanced emission in accordance with the present invention.

As illustrated in FIG. 1, in a first exemplary embodiment of an LED device in accordance with the present invention, a plasmonic metal-coated inverted LED heterostructure is provided, wherein the structure includes an active quantum well region such as QW region 101, highly n-type doped n+ AlGaN layer 102 disposed on an upper side of QW region 101 to inject electrons into QW region 101, and a highly p-type doped p+ GaN layer 103 disposed on the opposite side of QW region to inject holes. As noted above, the n-type layer in an LED structure in accordance with the present invention is thin, less than 50 nm thick, preferably less than 30 nm thick, and the p-type layer has a thickness sufficiently large to spread the current over the LED area, typically about 500 to 5000 nm, and so in the embodiment shown in FIG. 1, n+ AlGaN layer 102 has a thickness of 20 nm and p+ GaN layer 103 has a thickness of 2000 nm. Active QW region 101 will typically be in the form of a layered (Al)GaN structure, for example, 5 nm AlGaN/4 nm GaN/5 nm AlGaN, though other materials having other thicknesses may be used as appropriate In the embodiment illustrated in FIG. 1, Mg is used as a dopant though other dopant materials and doping levels may be used as appropriate.

The n+ AlGaN layer 102 can be directly contacted with n-type Ohmic electrode 105, while p+ GaN layer 103 can be directly contacted by a p-type Ohmic electrode 106. The p-type layer 103 can be grown on a substrate 108 such as sapphire that is not directly involved in the electrical device operation and is separated from the p-type layer by a buffer layer, for example, 25 nm AN buffer layer 107.

In addition, as shown in FIG. 1, in accordance with the present invention, a periodic or random coating 104 of silver, gold, silver, copper or similar plasmonic metal is disposed on n+ AlGaN layer 102, the metal being chosen to match the plasmonic response to the peak emission from active QW region 101.

The plasmonic metal or a metal alloy with at least one component being a plasmonic metal can be used as the Ohmic contact to the structure; otherwise a separate Ohmic contact is needed. Current is injected into the device and excitons are formed in the active QW region in accordance with standard semiconductor physics principles well known in the art.

Because the n-type contact layer between the active QW region and the plasmonic metal surface is thin enough to cause the excitons to be within the SP fringing field, in accordance with the present invention, the excitons within the active QW region can couple to the SPs within or in close vicinity of the plasmonic metal, and as described above, this SP-exciton coupling thereby provides an alternative decay route for the excitons and enhances the photonic emission from the LED device.

FIG. 2 illustrates a second exemplary embodiment of an LED device in accordance with the present invention. An LED device in accordance with this embodiment avoids the necessity for a thick p-type layer as needed in the first embodiment and can be grown in a single step, thus simplifying fabrication.

This embodiment utilizes a tunnel junction 206 which can be composed of, for example, a 5 nm layer of p++ GaN 206a disposed on a 5 nm layer of n++ GaN 206b which in turn is disposed on an n-type substrate such as n+ 4H—SiC layer 208 having an n+ AlGaN cap 207. The use of such a tunnel junction avoids the necessity for a thick p-type layer as in the first embodiment, since the p- and n-type doping in tunnel junction 206 is sufficiently high to eliminate the p- and n-depletion barriers, thereby enabling the electrons to pass directly through junction 206. This in turn allows a non-rectified current flow from 4H—SiC layer 208 into the n+ AlGaN cap layer 207 and thus successful operation of the LED.

Thus, as illustrated in FIG. 2, a second exemplary embodiment of an LED device in accordance with the present invention can consist of an active region such as active QW region 201, a highly n-type doped n+ AlGaN layer 202 disposed on an upper side of QW region 201 to inject electrons into active QW region 201, and a highly p-type doped p+ GaN layer 203 on the opposite side of the active QW region 201 to inject holes. As with the structure in the first exemplary embodiment described above with respect to FIG. 1, in the embodiment illustrated in FIG. 2, active QW region 201 will typically be in the form of a layered (Al)GaN structure, for example, 5 nm AlGaN/4 nm GaN/5 nm AlGaN, though other materials having other thicknesses may be used as appropriate. Also, as with the first embodiment, the n-type layer in the LED structure according to this embodiment of the present invention is thin, less than 50 nm thick, preferably less than 30 nm thick. However, as noted above, the p-type layer in this second embodiment can be thinner than as in the first embodiment, typically about 10 to 1000 nm, due to the presence of tunnel junction 206 since the current is already and easily spread in the highly conductive n-type layers or substrate. Thus, in the embodiment shown in FIG. 2 as in FIG. 1, n+ AlGaN layer 202 has a thickness of 20 nm and p+ GaN layer 203 has a thickness of 500 nm.

As with the first embodiment, a periodic or random coating 204 of silver, gold, silver, copper or similar plasmonic metal is disposed on n+ AlGaN layer 202, with the material used being chosen to match the plasmonic response to the peak emission from the active QW region 201.

As with the previous embodiment, in this embodiment of a plasmonically enhanced inverted LED in accordance with the present invention the n-type contact layer between the active QW region and the plasmonic metal surface is thin enough to cause the excitons to be within the SP fringing field such that the excitons within the active QW region couple to the SPs within or near the plasmonic metal, and as described above, this SP-exciton coupling thereby provides an alternative decay route for the excitons and enhances the photonic emission from the LED device.

The inverted LED structures as depicted in FIGS. 1 and 2 were grown in an impinging-flow metal-organic chemical vapor deposition system. The structure shown in FIG. 1 was grown in two steps to avoid the Mg memory effect known in the art. Specifically, 2000 nm p-type GaN layer 103 was grown on a double sided polished sapphire substrate 108. Following deposition of the p-type layer 103, the reaction chamber was cleaned, and subsequently active QW layer 101 and n-type AlGaN contact layer 102 were deposited on the p-type layer 103.

In contrast, the structure shown in FIG. 2 can be grown in one continuous step. The p- and n-type doping in tunnel junction 206 is sufficiently high to eliminate the p- and n-depletion barriers, thereby enabling the electrons to pass directly through the junction and inject carriers into the active QW region 201. This in turn allows a non-rectified current flow from the 4H—SiC layer 208 into the n+ AlGaN cap layer 207 and thus successful operation of the LED.

Figure 3:
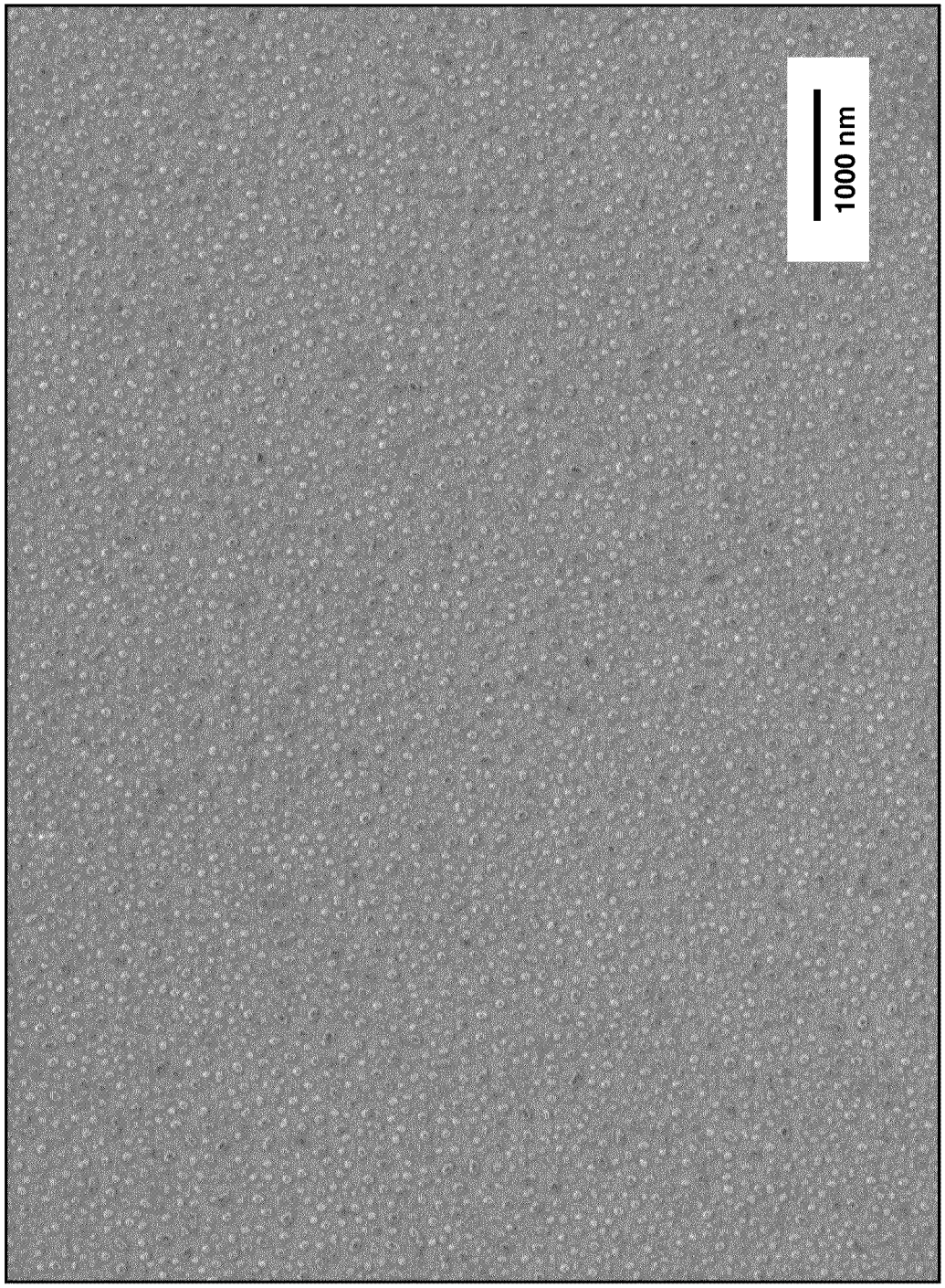
FIG. 3 is a scanning electron micrograph of silver nanoparticles deposited on a surface of an inverted LED having plasmonically enhanced emission in accordance with the present invention.

FIG. 3 illustrates an exemplary embodiment of the plasmonic metal coating disposed on an inverted LED structure in accordance with the present invention. In such an exemplary embodiment, the plasmonic metal coating consists of a discontinuous silver film with a target thickness of approximately 100 nm deposited in an e-beam evaporator onto the surface of the LED structure. The silver islands were exposed to a rapid thermal anneal, e.g., for 1 min at 700° C. This resulted in the coating illustrated in FIG. 3, consisting of ensemble of silver nanoparticles dispersed on the sample surface with an average diameter of 150 nm. Other plasmonic coatings that can be used in accordance with the present invention include structures composed of gold, copper, platinum, alloys thereof, or other material displaying a strong plasmonic response at the wavelength of emission. The structure can be a random or a layer of spheres, hemispheres, bow-ties, cylinders, or squares arranged as a two-dimensional array. A similar structure that is also in accordance with the present invention is a two-dimensional array of holes in a thin film where the holes are shaped as e.g., circles, ellipses, squares, rectangles, triangles, or bow ties.

Thus, in accordance with the present invention, a plasmonic layer metal nanoparticles can be deposited on the top n-type contact layer of an inverted LED structure, and if the n-type contact layer is sufficiently thin, surface plasmons from the metal layer can couple with the excitons in the active QW emission region to provide an alternate decay route for the excitons and improve the probability that the exciton will decay and scatter as photons emitted from the LED.

RESULTS

A two-dimensional coupled dipole approximation method was employed to model the electromagnetic behavior of an array of silver nanoparticles on the surface of AlGaN surrounded by air. See e.g., LinLin Zhao, K, Lance Kelly, and George C. Schatz, "The Extinction Spectra of Silver Nanoparticle Arrays: Influence of Array Structure on Plasmon Resonance Wavelength and Width," *J. Phys. Chem. B* 2003, 107, 7343-7350; Rene bullock, Stefan Grafström, Paul R. Evans, Robert J. Pollard, and Lukas M. Eng, "Metallic nanorod arrays: negative refraction and optical properties explained by retarded dipolar interactions." *J. Opt. Soc. Am. B*, Vol. 27, No. 9 pp. 1819-1827 (September 2010).

Figure 4:
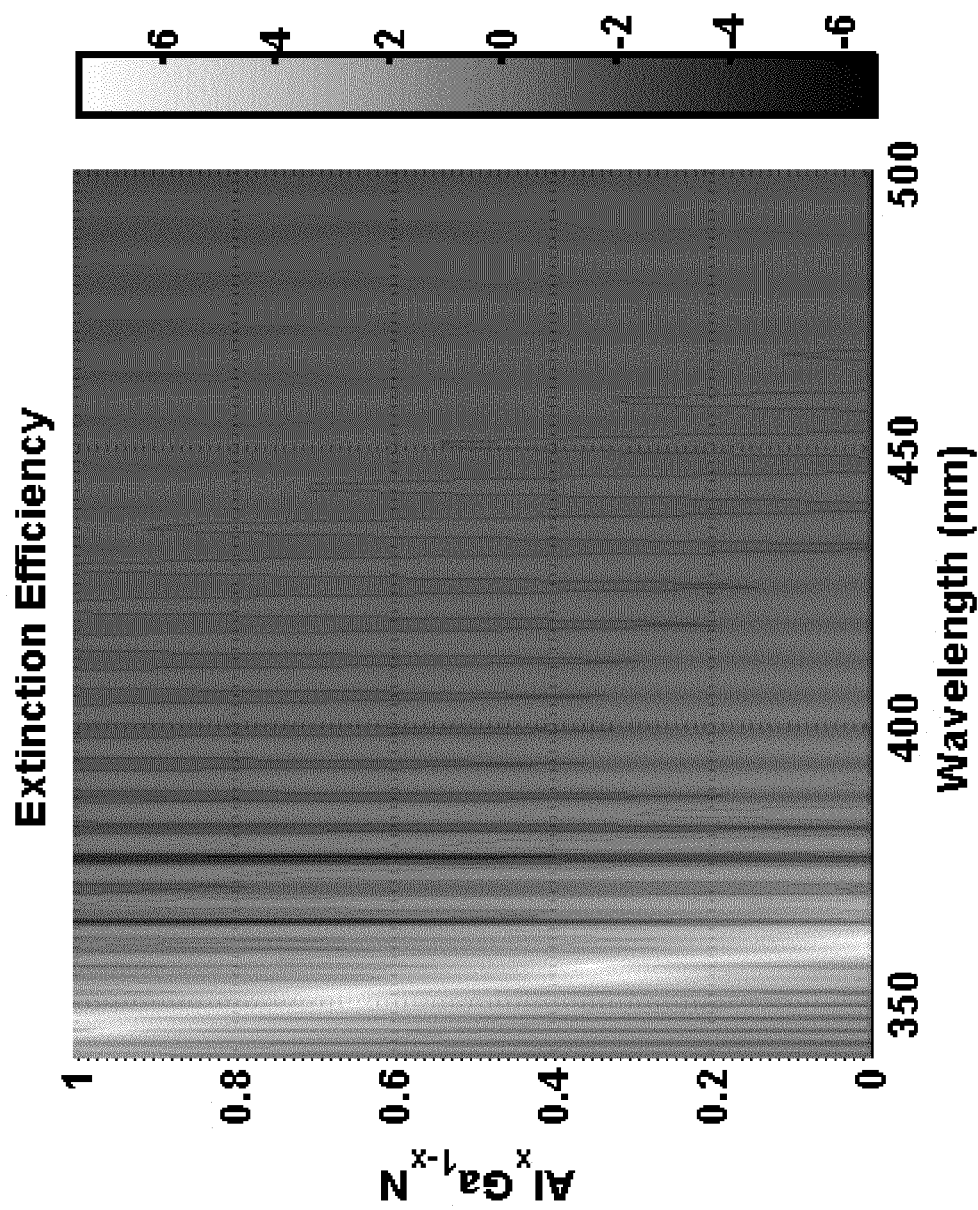
FIG. 4 is a plot of a simulation illustrating the extinction efficiency for an array of silver nanoparticles situated at an $Al_xGa_{1-x}N$/air interface.

FIG. 4 shows that alloying AN into the GaN contact layer leads to a blue-shift in the extinction peak. In the exemplary case illustrated in FIG. 4, $Al_{0.1}Ga_{0.9}N$ was selected to improve injection efficiency into the GaN quantum well. FIG. 4 shows that a peak in extinction efficiency was found at 365 nm for the array of silver nanoparticles with a diameter of 150 nm and particle-to-particle center spacing of 225 nm situated at an $Al_{0.1}Ga_{0.9}N$/air interface. The rapid thermal annealing conditions were selected to produce a set of silver nanoparticles that closely resembled this geometry, and thus match the surface plasmon resonance to the quantum well near bandedge emission.

In addition, the model showed a complex dependence on inter-particle coupling relative to the single particle Mie resonance. Confinement of electrons in small noble-metal nanoparticles leads to an electromagnetic resonance upon plane-wave excitation. The charge within the silver nanoparticles move in phase, which creates an effective restoring force at the particle dipole plasmon frequency. See Kullock et al., supra. Thus, leading to a corresponding dipolar field forming in the near vicinity of the nanoparticles. Still, the electron-hole pairs in the metal can couple to the phonon bath, which leads to Ohmic heating. In essence the imaginary component of the metal dielectric response limits the polarizability.

Figure 5A:
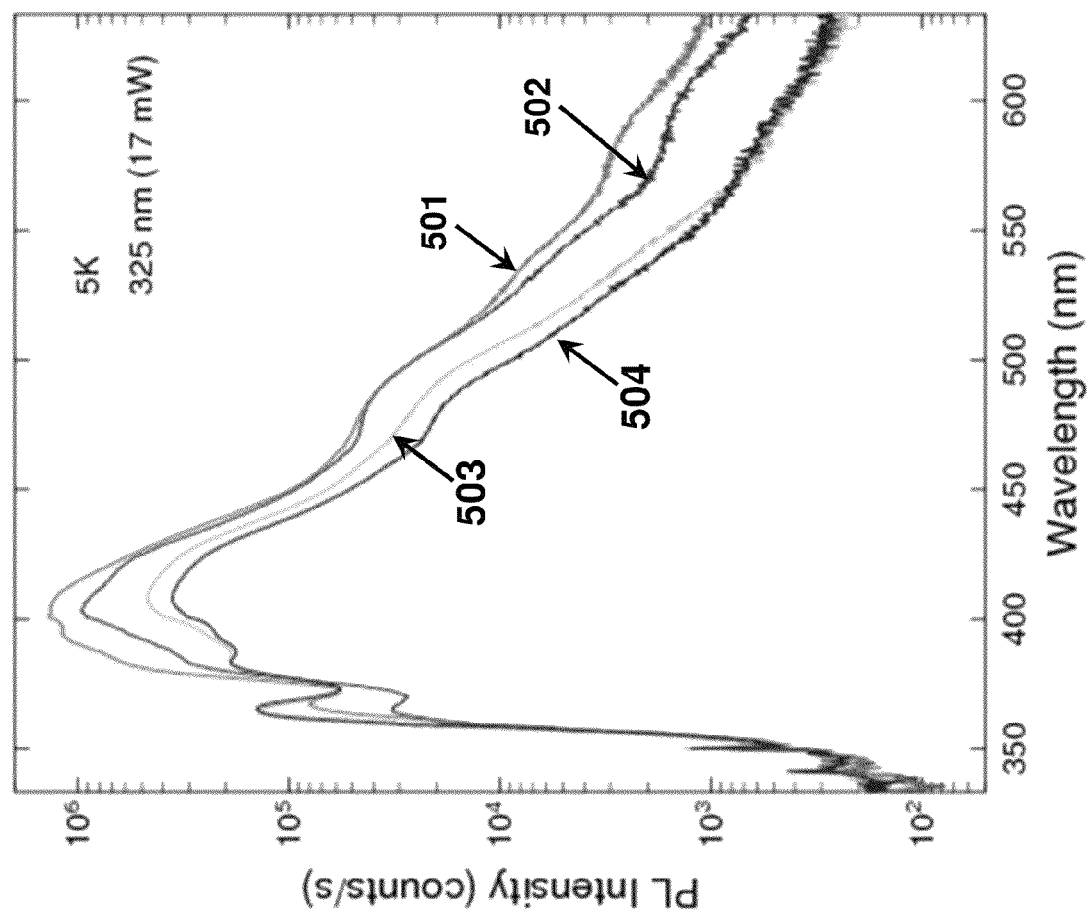
FIGS. 5A and 5B are plots illustrating the photoluminescence acquired at two different spectral ranges of an inverted LED having plasmonically enhanced emission in accordance with the present invention, where
Figure 5B:
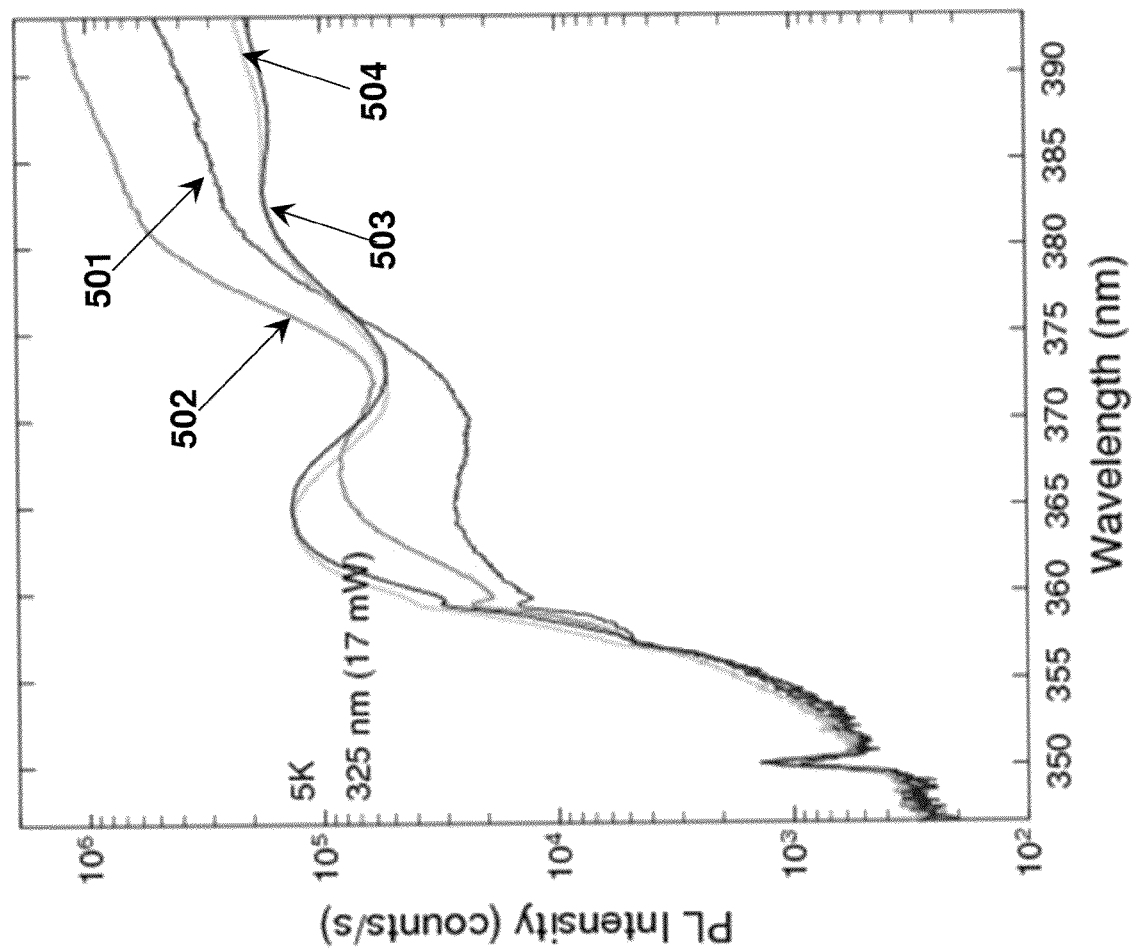

The luminescence of the sample was excited at 5K with the 325-nm line of a He—Cd laser is illustrated in FIGS. 5A and 5B, which plot the photoluminescence acquired at two different spectral ranges of an inverted LED with a silver nanoparticle coating. Two characteristic sample sets (plots 501/503 and 502/504, respectively) are displayed. The silver nanoparticles were designed to have a plasmon resonance coinciding with the 365 nm near bandedge emission of the GaN quantum well. The coupling with the on-resonant 365 nm emission led to an average approximate four times increase in luminescence.

The uncorrected photoluminescence spectra showed a factor of 5.2 and 3.6 increase (on two separate samples) in near bandedge emission from the silver coated structure in comparison to the emission prior to deposition. The wavelength of this enhancement (~365 nm) coincided with the surface plasmon resonance condition.

A time-resolved photoluminescence measurement found that the addition of the silver nanoparticles increased the photoluminescence decay rate by a factor of 3.81. As noted above, excitons generated in the active region can decay radiatively as a photon or non-radiatively as dissipated heat in the lattice; alternatively, the exciton energy can be transferred to the surface plasmons. At this point, the coupled surface plasmon energy in the metal can decay as dissipated heat, which in turn would quench the emission. The increase in decay rate indicates that an alternate mechanism is provided by the nanostructure of the particles, which creates an ensemble of scattering sites that bridges the momentum mismatch to rapidly convert the energy to free space radiation. See K. W. Liu, Y. D. Tang, C. X. Cong, T. C. Sum, A. C. H. Huan, Z. X. Shen, Li Wang, F. Y. Jiang, X. W. Sun, and H. D. Sun, "Giant enhancement of top emission from ZnO thin film by nanopatterned Pt," *Applied Physics Letters* 94, 151102 (2009). The similar increase in the intensity and the decay ratio of the photoluminescence confirms that the spontaneous emission wavelength-dependent enhancement was clearly strongest at the surface plasmon resonance energy where the surface plasmon DOS is high. See Liu, supra; see also Michael A. Mastro, Jaime A. Freitas Jr., Orest Glembocki, Charles R. Eddy Jr., R. T. Holm, Rich L. Henry, Josh Caldwell, Ronald W. Rendell, Fritz Kub and J. Kim, "Plasmonically enhanced emission from a group-III nitride nanowire emitter," *Nanotechnology* 18 (2007) 265401.

CONCLUSION

Silver thin films and nanoparticles deposited on the surface of InGaN quantum well structures have been demonstrated to plasmonically enhance the optically pumped emission from such structures. However, the necessity of placing the active region of the device within approximately 30 nm of the plasmonic metal presents a design dilemma for GaN-based LEDs, and consequently, nearly all previous demonstrations of exciton-to-surface plasmon coupling have been based on quantum well structures that are not designed for electroluminescence.

The present invention overcomes these drawbacks and provides plasmonic enhancement of an inverted LED structure. A variety of inverted LED structures were developed with the key design of a thin n-type (In,Al)GaN top contact layer which brings the quantum well into the fringing field of the silver nanoparticles. This proximity allowed the excitons induced within the quantum well to couple to the surface plasmons, thereby increasing the emission by approximately a factor of four in a functional LED. Furthermore, the inverted LED allows flexibility in the alloy composition of the top contact layer, which alters the dielectric environment and plasmonic response of the metal. The approach of the present invention can be extended to any inverted (In,Al)GaN LED by tailoring the size of the noble metal nanoparticles and consequently the location of the resonant surface plasmon energy to match the UV, violet, blue, or green emission.

In addition, the coupling concept of the present invention can be applied to any plasmonic structure including:

A thick film similar to a reflective coating in which a suitable roughness will scatter the plasmon into photon;

A thin film that will have a surface plasmon at the semiconductor/metal and at the metal/air (or packaging material) interfaces, wherein a certain roughness can similarly scatter the plasmon into photon and wherein top and bottom surface plasmon polaritons can couple if the metal film is thin (i.e., <5 nm) forming a symmetric mode and a lossy asymmetric mode; and A metal photonic crystal structure composed of an array of holes in a thin film or the converse structure of an array of cylinders, squares, or similar structure, wherein the periodicity of the array is set to diffract light out of the structure.

ADVANTAGES AND NEW FEATURES

The coupling of plasmonic metal nanoparticles on the surface of a standard thick p-type (InAl)GaN contact layer to the underlying active region has been shown to be poor. Inverting the LED structure with a thin n-type top layer brings the active QW emission region within the fringing field of the surface plasmonic metal and allows for coupling of the surface plasmons and the excitons from the active QW region which in turn provides enhanced emission from the LED.

ALTERNATIVES

The plasmonically enhanced light emitting device in accordance with the present invention can be composed of any semiconductor including GaN/AlGaN/InGaN/InAlGaN, ZnO/MgZnO, ZnSe/ZnMgSe, CdTe/CdZnTe and similar semiconductors.

In some embodiments, a second electrically injected light emitting diode or laser diode can optically pump the primary light emitting device with the plasmonic metal coating, with one or both devices stimulating a luminophoric medium in the same assembly.

The light emitting structure can also be shaped as one or more rods, or one or more wires.

The structure can also constitute a single component in a multiple-component module.

In any case, although particular embodiments, aspects, and features have been described and illustrated, one skilled in the art would readily appreciate that the invention described herein is not limited to only those embodiments, aspects, and features but also contemplates any and all modifications within the spirit and scope of the underlying invention described and claimed herein, and such combinations and embodiments are within the scope of the present disclosure.

What is claimed is:

1. A light emitting device having plasmonically enhanced emission, comprising:
   an inverted light emitting diode (LED) having a plasmonic metal coating thereon, the inverted LED comprising:
      an n-type substrate contacted to a first n-type electrode configured to provide an Ohmic contact to the n-type substrate;
      an n-type cap layer disposed on the n-type substrate;
      a tunnel junction disposed on the n-type cap layer, the tunnel junction comprising a highly doped n-type layer disposed on the n-type cap layer and a highly doped p-type layer disposed on the highly doped n-type layer, the tunnel junction being configured to allow a non-rectified current to flow from the n-type substrate into the n-type cap layer; and
      an active quantum well region disposed between a p-type layer on a bottom side thereof adjacent the p-type layer of the tunnel junction and an n-type contact layer on a top side thereof,
   the n-type contact layer having a plasmonic metal coating comprising a plurality of metal nanoparticles disposed on a first discrete region of the n-type contact layer,
   the n-type contact layer also having a second n-type electrode disposed on a second discrete region of the n-type contact layer, the second n-type electrode being contacted to the n-type contact layer to provide an Ohmic contact to the n-type contact layer, and
   the plasmonic metal coating and the second n-type electrode forming separate and discrete structures on the n-type contact layer;
   wherein the plasmonic metal coating is configured to match a plasmonic response to a peak emission from the active quantum well region and to generate a plurality of surface plasmons at an interface of the plasmonic metal coating and the n-type contact layer, the n-type contact layer being sufficiently thin to cause the active quantum well region to be within a fringing field of the surface plasmons;
   wherein electrons from the n-type contact layer and holes from p-type layer form electron-hole pairs in the active quantum well region upon the application of current to the inverted LED via the first and second n-type Ohmic contacts;
   wherein a first plurality of the electron-hole pairs decay via a first decay route to produce a first light emission from the light-emitting device; and
   wherein the second plurality of the electron-hole pairs couple with a corresponding plurality of the surface plasmons and decay via a second decay route provided by the coupling of the electron-hole pairs and the surface plasmons to produce a second light emission from the light-emitting device;
   the first and second light emissions providing an enhanced light emission from the light-emitting device.

2. The light emitting device according to claim 1, wherein the n-type contact layer has a thickness of less than 50 nm.

3. The light emitting device according to claim 1, wherein the n-type contact layer has a thickness of less than 30 nm.

4. The light emitting device according to claim 1, wherein the n-type contact layer comprises one of GaN, AlGaN, InGaN, InAlGaN.

5. The light emitting device according to claim 1, wherein the n-type contact layer is a highly doped n+ AlGaN layer having a thickness of about 20 nm.

6. The light emitting device according to claim 1, wherein the p-type layer comprises one of GaN, AlGaN, InGaN, InAlGaN.

7. The light emitting device according to claim 1, wherein the p-type layer has a thickness of about 10 to 1000 nm.

8. The light emitting device according to claim 1, wherein the p-type layer is a highly doped p+ GaN layer having a thickness of about 500 nm.

9. The light emitting device according to claim 1, wherein the tunnel junction comprises a p++ GaN layer disposed on an n++ GaN layer.

10. The light emitting device according to claim 9, wherein each of the p++ GaN layer and the n++ GaN layer have a thickness of 5 nm.

11. The light emitting device according to claim 1, wherein the n-type cap layer is an n-type GaN layer.

12. The light emitting device according to claim 1, wherein the plasmonic metal coating comprises a periodic coating of metal nanoparticles.

13. The light emitting device according to claim 1, wherein the plasmonic metal coating comprises a coating of one of silver, gold, and copper.

* * * * *